(12) United States Patent
Barabi et al.

(10) Patent No.: US 11,378,588 B2
(45) Date of Patent: Jul. 5, 2022

(54) CONTACTOR WITH ANGLED DEPRESSIBLE PROBES IN SHIFTED BORES

(71) Applicant: ESSAI, INC., Fremont, CA (US)

(72) Inventors: Nasser Barabi, Lafayette, CA (US); Oksana Kryachek, San Francisco, CA (US); Joven R. Tienzo, Fremont, CA (US); Chee Wah Ho, Fremont, CA (US)

(73) Assignee: ESSAI, INC., Fremont, CA (US)

( * ) Notice: Subject to any disclaimer, the term of this patent is extended or adjusted under 35 U.S.C. 154(b) by 0 days.

(21) Appl. No.: 17/090,779

(22) Filed: Nov. 5, 2020

(65) Prior Publication Data

US 2021/0102972 A1     Apr. 8, 2021

Related U.S. Application Data

(63) Continuation-in-part of application No. 16/687,240, filed on Nov. 18, 2019, now abandoned, which is a continuation of application No. 15/707,958, filed on Sep. 18, 2017, now Pat. No. 10,481,175, which is a continuation of application No. 12/005,139, filed on Dec. 21, 2007, now Pat. No. 9,766,268.

(60) Provisional application No. 63/083,575, filed on Sep. 25, 2020, provisional application No. 60/876,909, filed on Dec. 21, 2006.

(51) Int. Cl.
    *G01R 1/04*     (2006.01)
(52) U.S. Cl.
    CPC .......... *G01R 1/0483* (2013.01); *G01R 1/0466* (2013.01)

(58) Field of Classification Search
    None
    See application file for complete search history.

(56) References Cited

U.S. PATENT DOCUMENTS

| | | | |
|---|---|---|---|
| 5,092,774 A | 3/1992 | Milan | |
| 5,451,883 A | 9/1995 | Staab | |
| 5,773,998 A * | 6/1998 | Hughes | G06G 7/184 327/334 |
| 5,945,836 A | 8/1999 | Sayre et al. | |
| 6,046,597 A | 4/2000 | Barabi | |
| 6,194,908 B1 * | 2/2001 | Wheel | G01R 1/07328 324/756.04 |
| 6,208,155 B1 | 3/2001 | Barabi et al. | |
| 6,220,870 B1 | 4/2001 | Barabi et al. | |
| 6,354,859 B1 | 3/2002 | Barabi et al. | |
| 6,407,565 B1 * | 6/2002 | Sayre | G01R 1/07328 324/754.14 |

(Continued)

*Primary Examiner* — Jermele M Hollington
(74) *Attorney, Agent, or Firm* — Kang S. Lim (57) ABSTRACT

A test probe contactor includes an angled depressible probe configuration that causes the tips of the compressible probes to "swipe" the contact pads/solder balls of an IC device under test as the contacts are made. The angulation of the depressible probes permit penetration through foreign material layers on the pad/ball surfaces with less contact force. The contactor includes an upper block and a main block for housing the plurality of probes. The main block and the upper block include corresponding pluralities of slanted probe cavities. The upper bore axis of one or more of the upper probe cavities is laterally shifted relative to the main bore axis of a corresponding probe cavity of the main block, resulting in a lateral offset between the upper bore axis and the main bore axis.

10 Claims, 9 Drawing Sheets

(56) References Cited

U.S. PATENT DOCUMENTS

| | | | |
|---|---|---|---|
| 6,441,632 B1 | 8/2002 | Correia et al. | |
| 6,980,013 B2 | 12/2005 | Machida et al. | |
| 7,268,568 B2 | 9/2007 | Machida et al. | |
| 7,477,066 B2* | 1/2009 | Kuo | G01R 1/07371 324/754.03 |
| 8,723,542 B2* | 5/2014 | Lin | G01R 31/69 324/755.05 |
| 9,766,268 B2 | 9/2017 | Barabi | |
| 10,481,175 B2* | 11/2019 | Barabi | G01R 1/0483 |
| 2003/0234656 A1 | 12/2003 | Willard | |
| 2007/0052432 A1 | 3/2007 | Machida et al. | |
| 2008/0150569 A1* | 6/2008 | Barabi | G01R 1/0483 324/754.14 |
| 2020/0225264 A1* | 7/2020 | Barabi | G01R 1/0483 |

\* cited by examiner

CONTACTOR WITH ANGLED DEPRESSIBLE PROBES IN SHIFTED BORES

CROSS-REFERENCE TO RELATED APPLICATIONS

This application is a continuation-in-part of and claims the benefit and priority of U.S. application Ser. No. 16/687,240, filed on Nov. 18, 2019, now abandoned; which claims the benefit and is a continuation of U.S. application Ser. No. 15/707,958, filed on Sep. 18, 2017, now U.S. Pat. No. 10,481,175; which application claims the benefit and is a continuation of U.S. application Ser. No. 12/005,139, filed on Dec. 21, 2007, now U.S. Pat. No. 9,766,268; which in turn claims the benefit of U.S. Provisional Application No. 60/876,909, filed Dec. 21, 2006, expired.

This application also claims the benefit and priority of U.S. Provisional Application No. 63/083,575, filed Sep. 25, 2020. All of the above-referenced applications/patents are incorporated herein in their entirety by this reference.

BACKGROUND

The present invention generally relates to test contactors used to establish an electrical interface between an integrated circuit (IC) device under test, and a circuit board, and more particularly, relates to the need to obtain a clean and dependable electrical contact between the spring probes of a contactor and the device under test (DUT).

The dependability of the electrical connection between the spring probes of the contactor and the contact pads or solder balls of a DUT package can be affected by the ability of the spring probes to penetrate through foreign material layers on the DUT's contact pads/solder balls (sometimes referred to herein as simply "contact pads"). Heretofore, spring probe contactors have been designed such that the spring probes contact the DUT's contact pads perpendicularly, that is, at a 90 degree angle relative to the DUT package, referred to herein as the z-axis. With the rapidly increasing pad/ball densities of IC devices, contact resistance requirements for testing devices are being rapidly reduced. With such reduction, the ability to achieve a good and dependable contact with the pads/balls of the DUT package has become a difficult problem, due the difficulty of penetrating the foreign material layers on the contact/ball surfaces. Resulting decrease in reliability in the contacts have led to costly retesting, and to the unnecessary rejection of tested IC devices.

The present invention overcomes the limitations of conventional contact designs by providing for an improved contactor capable of achieving good and dependable electrical contacts with the pads/solder balls of an IC package with a minimum contact force.

SUMMARY

Briefly, the invention is directed to a depressible probe contactor capable of achieving good and dependable electrical contacts with the contact pads and solder balls of an IC device with depressible forces that are relatively low as compared to the depressible probes of conventional contactors. A contactor provides for a depressible probe configuration that causes the tips of the spring probes to "swipe" the contact pads/solder balls as the contacts are made, to permit penetration through foreign material layers on the pad/ball surfaces with less contact force.

The foregoing advantages are achieved by providing a contactor comprised of a contactor body having a top face and a bottom face substantially parallel to said top face, wherein the top and bottom faces of the body portion define contactor interface wall lying in an x-y plane, and wherein the z-axis defines the perpendicular to the interface wall. A plurality of depressible probes (pogo-pins) provided in the interface wall have probe tips that extend beyond the faces of the contactor. The probes arranged in the interface wall of the contactor body at an angle relative to the contactor's z-axis, such that one end of the probe tips emerge at an angle from the top face of the interface wall. The probes are configured in an angled array or arrays that cause the probe tips at the top face of the interface wall to match the configuration of contact pads/solder balls of a device under test when the DUT is placed against the top face of the contactor interface wall. Because the probe tips emerge from the top face of the contactor at an angle, they will swipe across the contact pad/ball surfaces as the probe tips are depressed by the DUT. The swiping action will allow the probe tips to more easily penetrate foreign material on the pad/ball surfaces for achieving a reliable contact with a lower spring force. This, in turn, will allow probes with lower compressible forces to be used, which would be particularly advantageous in high-density IC chip packages.

It is noted that the angled spring probes provide yet another advantage, in that, they tend to force the probe tips against the conductive walls of the probe barrels, thereby improving the overall conductivity of the probes.

The probes of the angled array or arrays can be either single-ended (one probe tip is not depressible) or double-ended compressible probes (both probe tips are depressible). For single-ended probes, it is contemplated that the probe tips emerging from the top face of the interface wall of the contactor can be fixed (non-depressible) with the probe tip emerging from the bottom face of the interface wall for contacting the test board. However, is would be possible to reverse the probe tips of the single-ended probes.

In an alternative aspect of the invention, two probe arrays are provided, wherein each of the arrays is oriented at a different angle relative to the other spring probe array. Such the arrays are configured in the contactor interface wall such that the probe tips of the two arrays emerge from the top face of the contactor at different angles. Providing probe arrays with a different angle orientations increases flexibility in matching different DUT pad or solder ball patterns. It also tends to balance the lateral exerted on the DUT by the angled probes tips.

In some embodiments, the test probe contactor incudes an upper block, a main block and a lower block for housing the plurality of probes. The main block includes a plurality of main slanted probe cavities oriented at an acute angle to a vertical axis of the test probe assembly. The upper block also includes a plurality of upper slanted probe cavities oriented at the acute angle to the vertical axis. The upper bore axis of one or more of the upper probe cavities is laterally shifted relative to the main bore axis of a corresponding probe cavity of the main block, resulting in a lateral offset between the upper bore axis and the main bore axis.

Note that the various features of the present invention described above may be practiced alone or in combination. These and other features of the present invention will be described in more detail below in the detailed description of the invention and in conjunction with the following figures.

DESCRIPTION OF THE DRAWINGS

In order that the present invention may be more clearly ascertained, some embodiments will now be described, by way of example, with reference to the accompanying drawings, in which.

DETAILED DESCRIPTION

The present invention will now be described in detail with reference to several embodiments thereof as illustrated in the accompanying drawings. In the following description, numerous specific details are set forth in order to provide a thorough understanding of embodiments of the present invention. It will be apparent, however, to one skilled in the art, that embodiments may be practiced without some or all of these specific details. In other instances, well known process steps and/or structures have not been described in detail in order to not unnecessarily obscure the present invention. The features and advantages of embodiments may be better understood with reference to the drawings and discussions that follow.

Aspects, features and advantages of exemplary embodiments of the present invention will become better understood with regard to the following description in connection with the accompanying drawing(s). It should be apparent to those skilled in the art that the described embodiments of the present invention provided herein are illustrative only and not limiting, having been presented by way of example only. All features disclosed in this description may be replaced by alternative features serving the same or similar purpose, unless expressly stated otherwise. Therefore, numerous other embodiments of the modifications thereof are contemplated as falling within the scope of the present invention as defined herein and equivalents thereto. Hence, use of absolute and/or sequential terms, such as, for example, "consist", "will," "will not," "shall," "shall not," "must," "must not," "only," "first," "initially," "next," "subsequently," "before," "after," "lastly," and "finally," are not meant to limit the scope of the present invention as the embodiments disclosed herein are merely exemplary.

Figure 1:
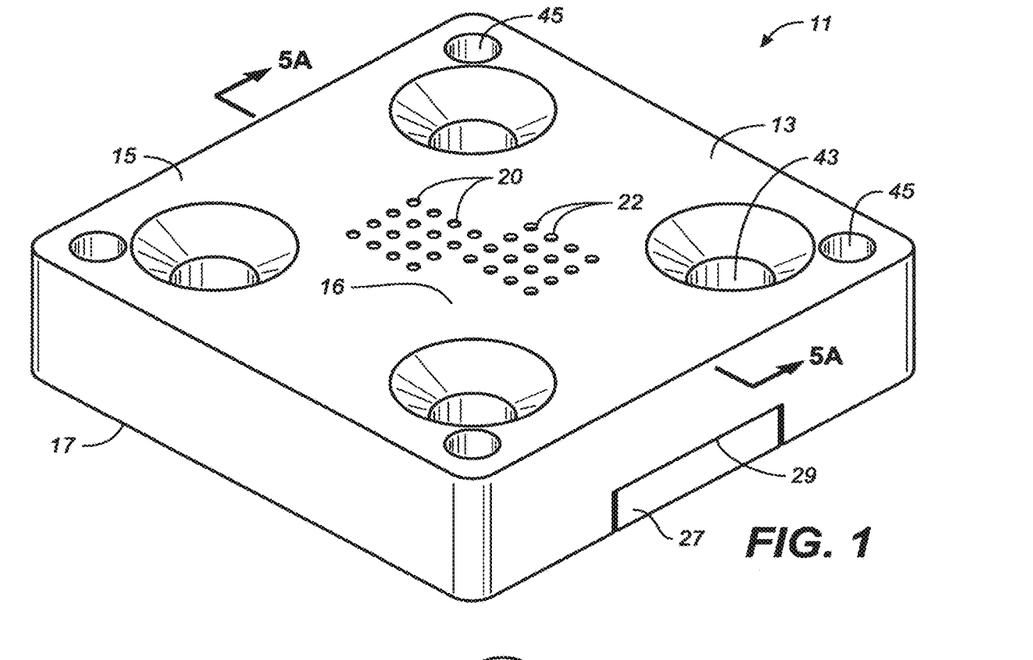
FIG. 1 is top perspective view of a spring probe contactor in accordance with the invention.
Figure 2:
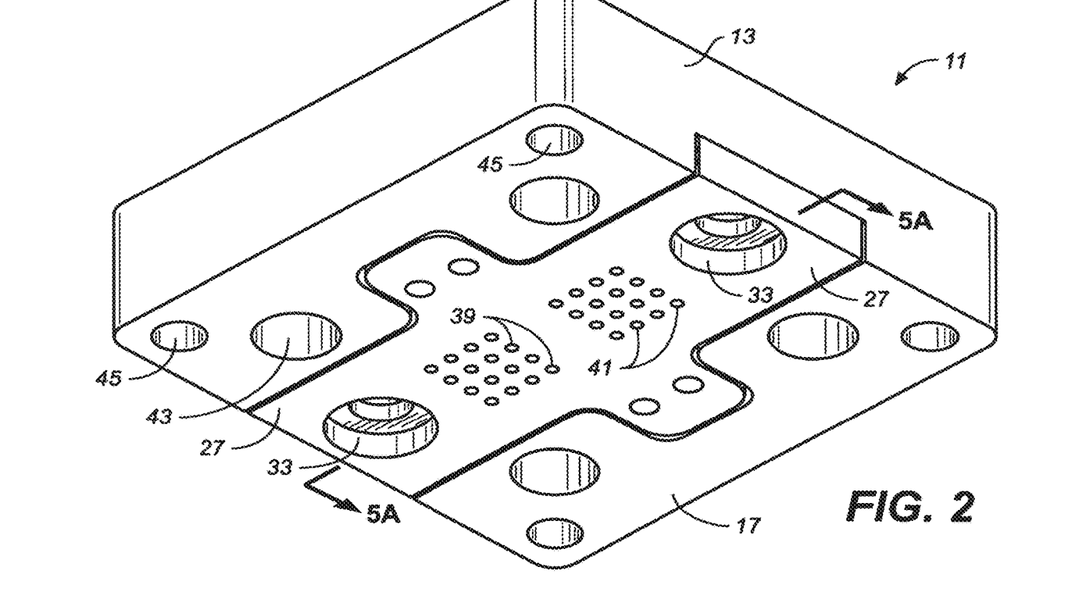
FIG. 2 is a bottom perspective view thereof.
Figure 3:
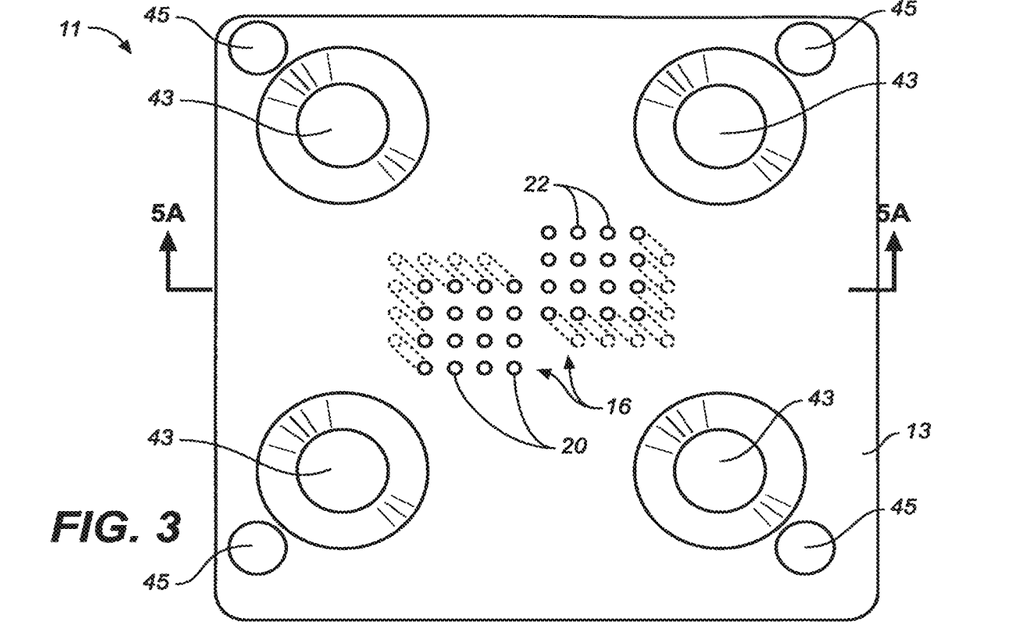
FIG. 3 is a top plan view thereof.
Figure 4:
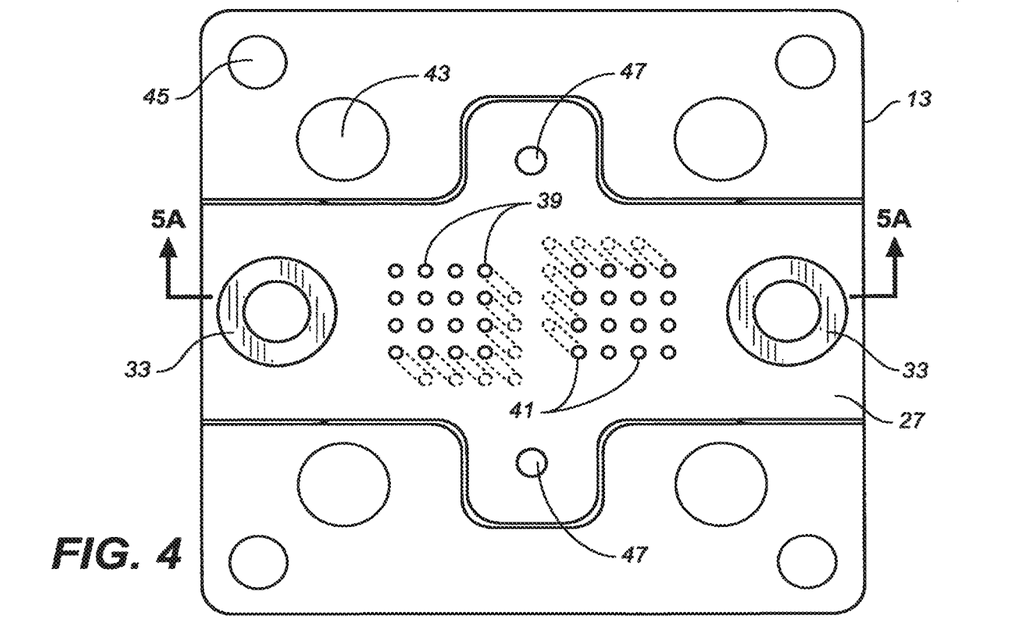
FIG. 4 is a bottom plan view thereof.
Figure 5A:
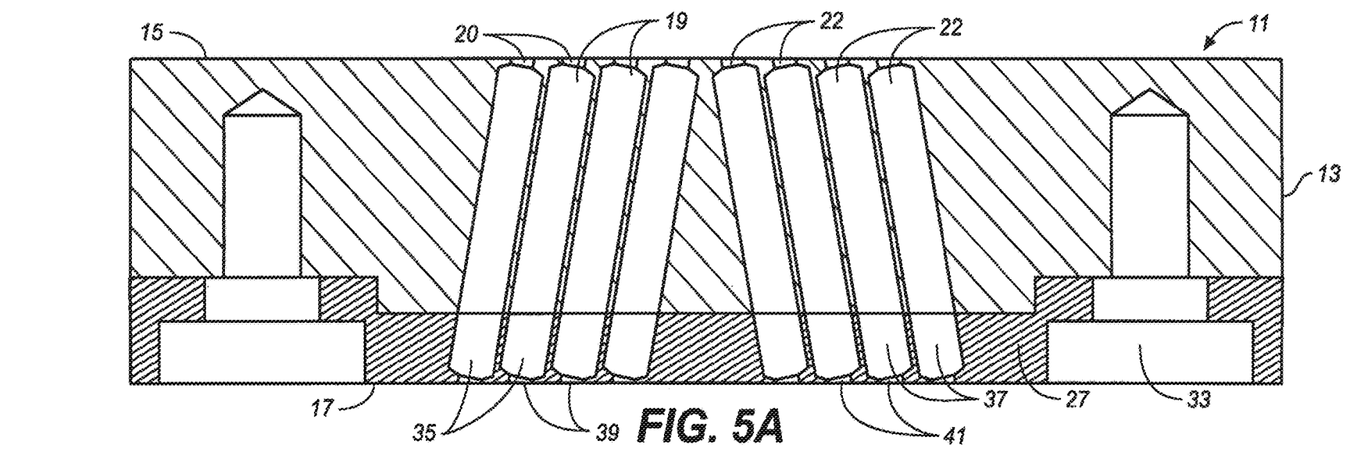
FIG. 5A is an enlarged cross-sectional view thereof, taken along lines 5A-5A in the foregoing figures, without the spring probes.

Referring to the drawings, spring probe contactor 11 includes a body portion 13 having parallel top and bottom faces 15, 17 defining contactor interface wall 16. As best illustrated in FIG. 5A, two sets of angled spring probe retention cavities 19, 21 extend through the interface wall 16 and terminate at the contactor's top face 13 in two arrays of small diameter spring pin openings 20 and 22. The arrays of spring pin openings 20, 22 are designed to match the footprint of the contact pads/solder balls for particular IC devices for which the contactor will be used.

Figure 5B:
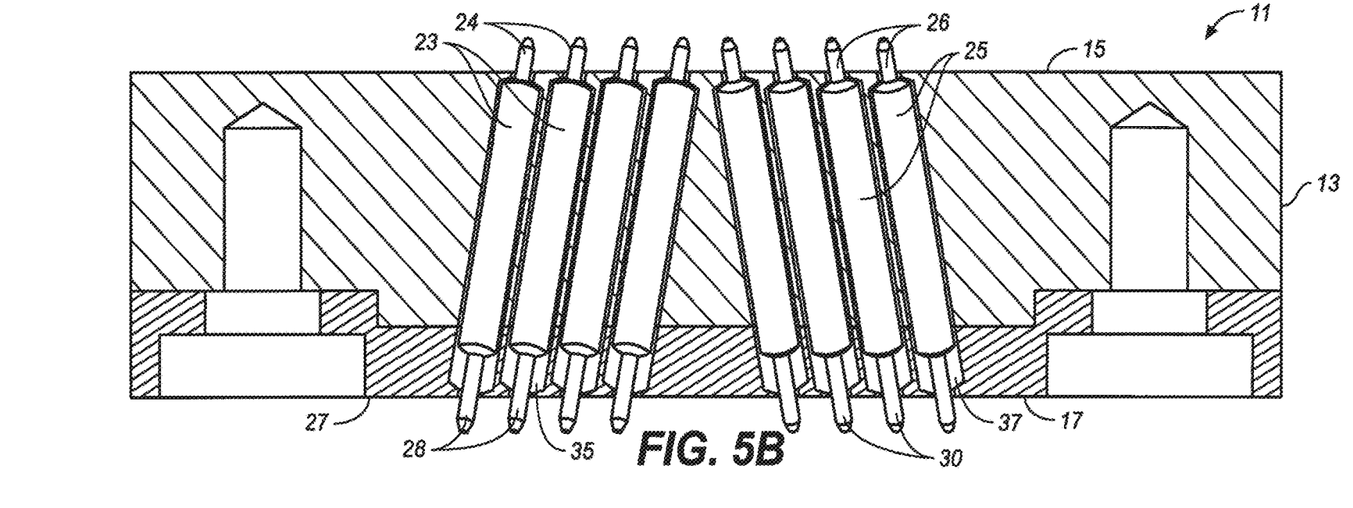
FIG. 5B is the cross-sectional view shown in FIG. 5A with the spring probes loaded into the spring probe cavities of the contactor body.

As illustrated in FIG. 5B, two sets of single-ended spring probes 23, 25 having non-depressible probe tips 24, 26 and depressible spring-loaded probe tips 28, 30 are loaded into the angled spring probe retention cavities 19, 21 from the bottom face side of the contactor. As seen in FIG. 5B, when the spring probes 23, 25 are fully inserted into the retention cavities 19, 21, their probe tips 24, 26 extend through and emerge from the array of openings 20, 24 on the contactor's top face. Due to the angulation of the spring probes, these probe tips project beyond the top face of the contactor at an angle, which is different for each set of spring probes. Preferably, the angles of projection for the first set of spring tips 24 in reference to the z axis of the contactor will be equal and opposite to the angle of the set of spring tips 26 about the z-axis. By providing a separate array of spring probes having an equal number of probes in each array, and angled in opposing directions, the lateral forces exerted on the IC chip by the probe tips will be substantially balanced in the x-y plane.

The spring probe arrays 23, 25 are held into the contactor body by means of a retainer plate 27. A recess 29 is provided in the bottom face of the contactor body for receiving this retainer plate. The retainer plate can be held to the contactor body by means of suitable retaining screws inserted through counter-sunk screw openings 33 in the retainer plate and threaded into screw holes 31 in the contactor body.

It can be seen that the two sets of spring probe cavities 35, 37 are provided in the central area of the retainer plate to accommodate the back end of the spring probes at the bottom face of the contactor. Each of the cavities 35, 37 will be long enough to allow the spring probe barrels to move downwardly when the DUT is pressed against the probe tips at the top face of the contactor interface wall. Cavities 35, 37 are seen to terminate in a small pin opening 39, 41, through which the depressible spring probe tips 28, 30 can extend for contacting the electrical contact points of a test board.

The angulation of the spring probes in the contactor body relative to the z axis will depend on the particular application. The length of the swipe of the spring tips 24, 26 of the spring probes across the contact pads/solder balls of an IC device can be designed by the choice of the spring probe angulation and the length of the depressible spring tips 24, 26. Generally, it is contemplated that the angulation relative to the z axis will be in a range of 2 to 25 degrees, with a preferred angulation in the range of 10 to 20 degrees.

The contactor is suitably held to a test board by means of mounting screws inserted through mounting holes 43 in the corners of the contactor body. The contactor body is further suitably provided with alignment pin holes 45 for achieving a precise alignment of the contactor on the test board. Suitable alignment means can also be provided between the contactor body and retaining plate 27, such as providing a key structure or alignment pin holes in the contactor body and retaining plate (such as using alignment pins in alignment holes 47 in the retaining plate).

Figure 6:
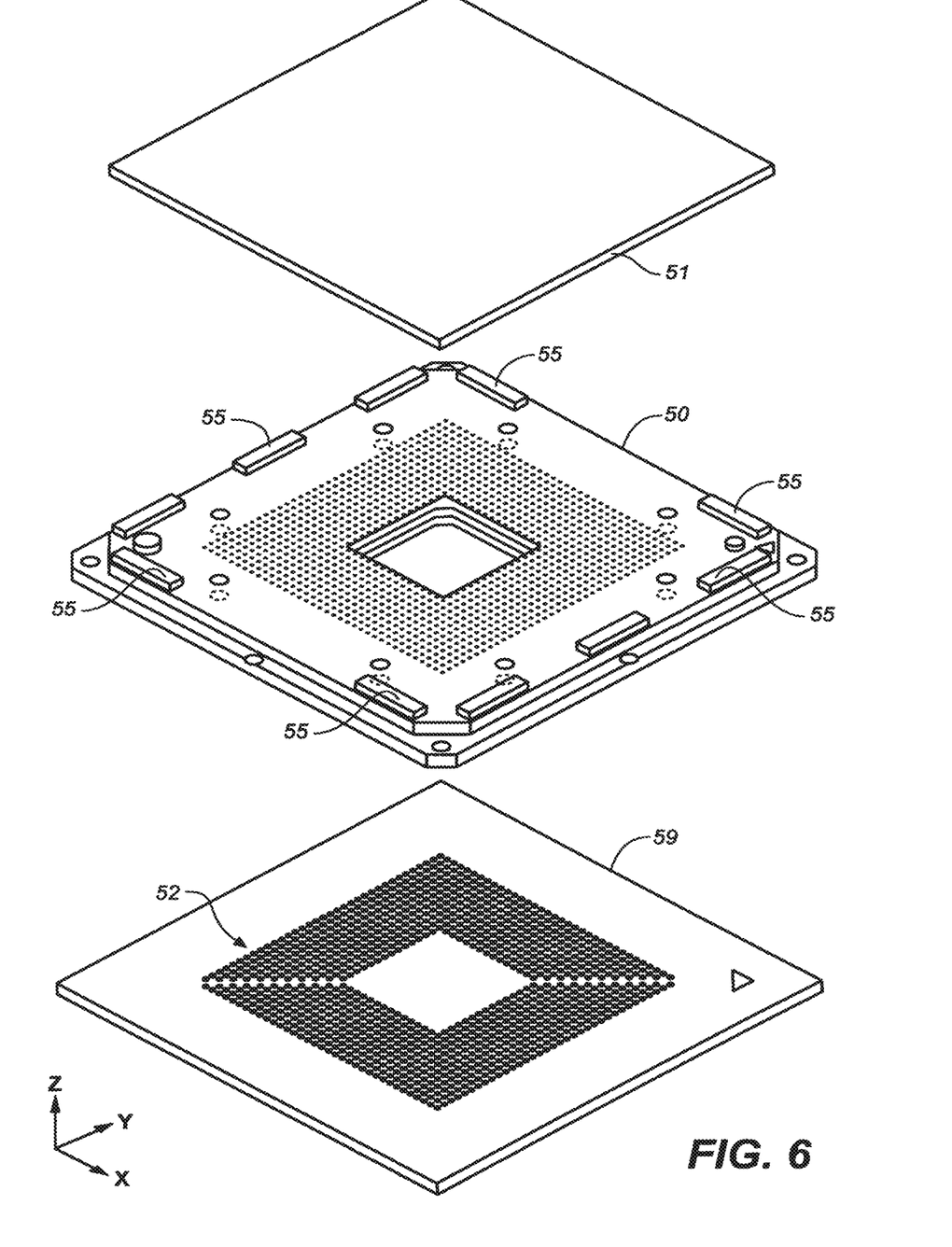
FIG. 6 is an exploded view of a contactor, IC device, and test board illustrating the use of the contactor.
Figure 7:
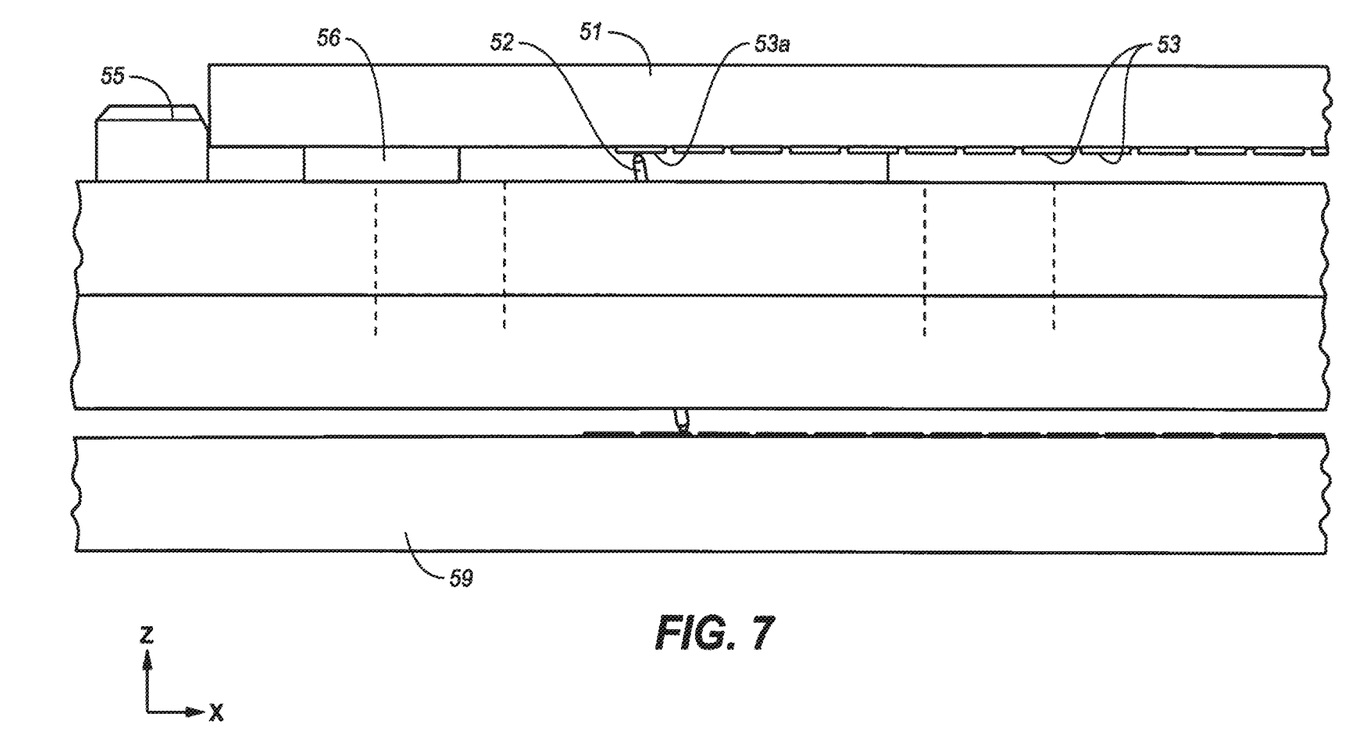
FIG. 7 is an enlarged cut-away view of the spring probe contactor, IC device under test, and test board shown in FIG. 6, with the DUT pressed against the contactor, and illustrating how the angled spring probes contact the contact pads of the DUT.

FIGS. 6 and 7 illustrate a practical implementation of a contactor using angled spring probes in accordance with the invention. In FIGS. 6 and 7, the IC device under test (DUT), denoted by the numeral 51, and the test board, denoted by the numeral 59, are shown. For ease of illustration, only one spring probe of the two arrays of spring probes is illustrated in FIG. 7. The spring probes can be single-ended as described above in connection with the illustrative embodiment shown in FIGS. 1-5.

As generally shown in FIGS. 6 and 7, the DUT 51, which has contact pads 53, is dropped in the z axis down onto contactor 50 such that the probe tips 52 of the spring probes are pressed downwardly by the chip's contact pads, such as pad 53*a*. (The DUT is suitably pressed onto the contactor by a suitable lid and depressor mechanism not shown, but known in the art.) The chip is guided to the contactor by guide rails 55, and moves in the z-axis direction to a seating position against seating posts 56. As the chip is moved to the seating position, the angled probe tips 52 contact the DUT's contact pads 53 before the DUT reaches its seating position. As the DUT continues to toward its seating position, the probe tip moves in the x-y plane across the contact pads 53, thereby creating a swiping action.

The spring probes of the application shown in FIGS. 6 and 7 are suitably angled in the same direction. A retaining plate for the probes (not shown) is suitably provided on the bottom of the contactor body.

Figure 8A:
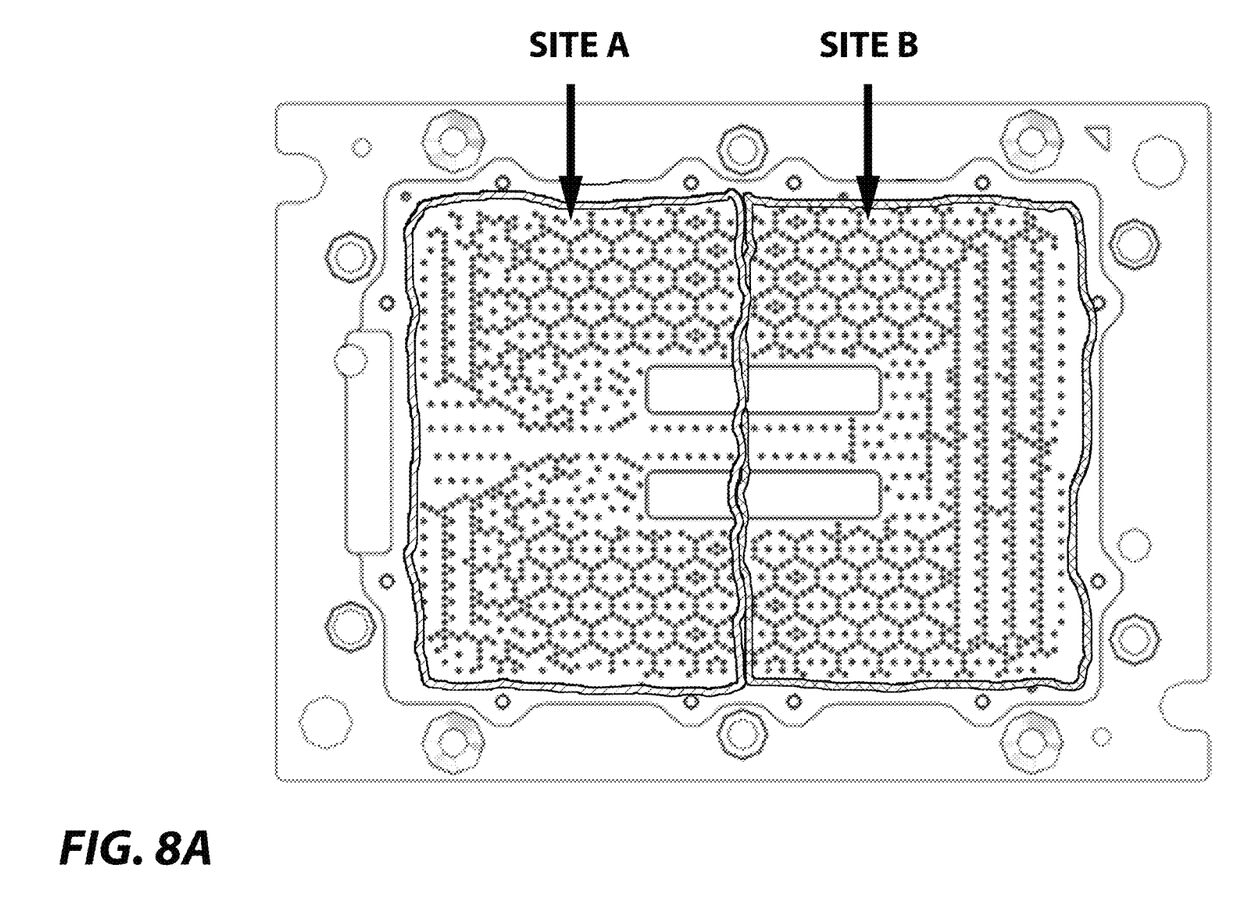
FIG. 8A is a plan view illustrating a typical high density test probe contactor, greatly enlarged for easier viewing.
Figure 10:
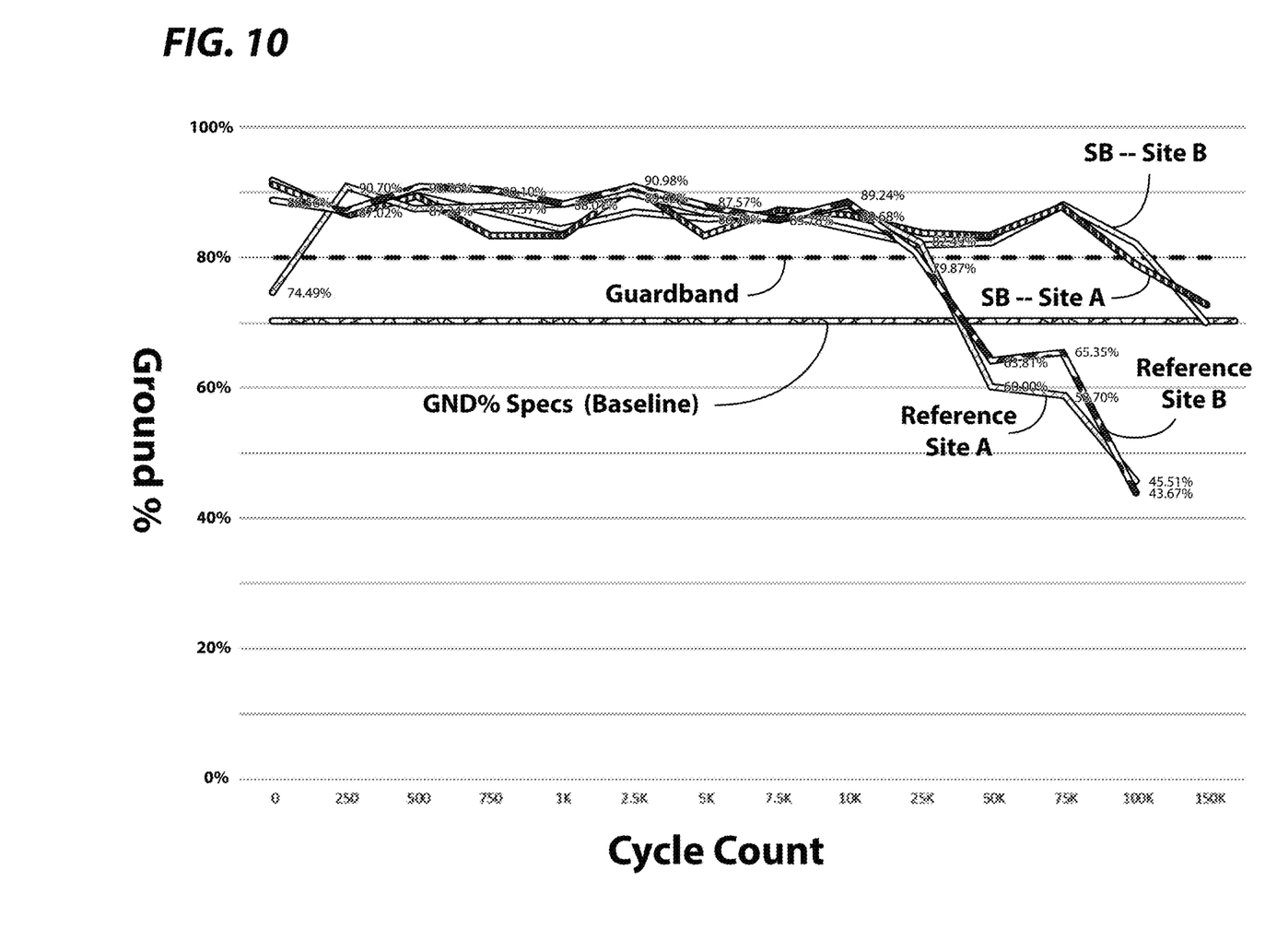
FIG. 10 is a graph illustrating the advantages of the embodiment depicted by FIG. 9.

To facilitate discussion, FIG. 8A is a plan view of the layout of pins (aka probes) for exemplary high density parts for test, and is useful for illustrating actual test results shown in FIG. 10. It should be noted that the left and right side labelled "SITE A" and "SITE B", respectively, house the pin (probe) arrangement, including reference standard pins and/or test pins, of the various embodiments, in accordance with this invention. Note that a typical pin separation in the exemplary test probe contactor is generally between 0.5 and 0.8 millimeter in this simple depiction of a typical segment of the contactor.

Figure 8B:
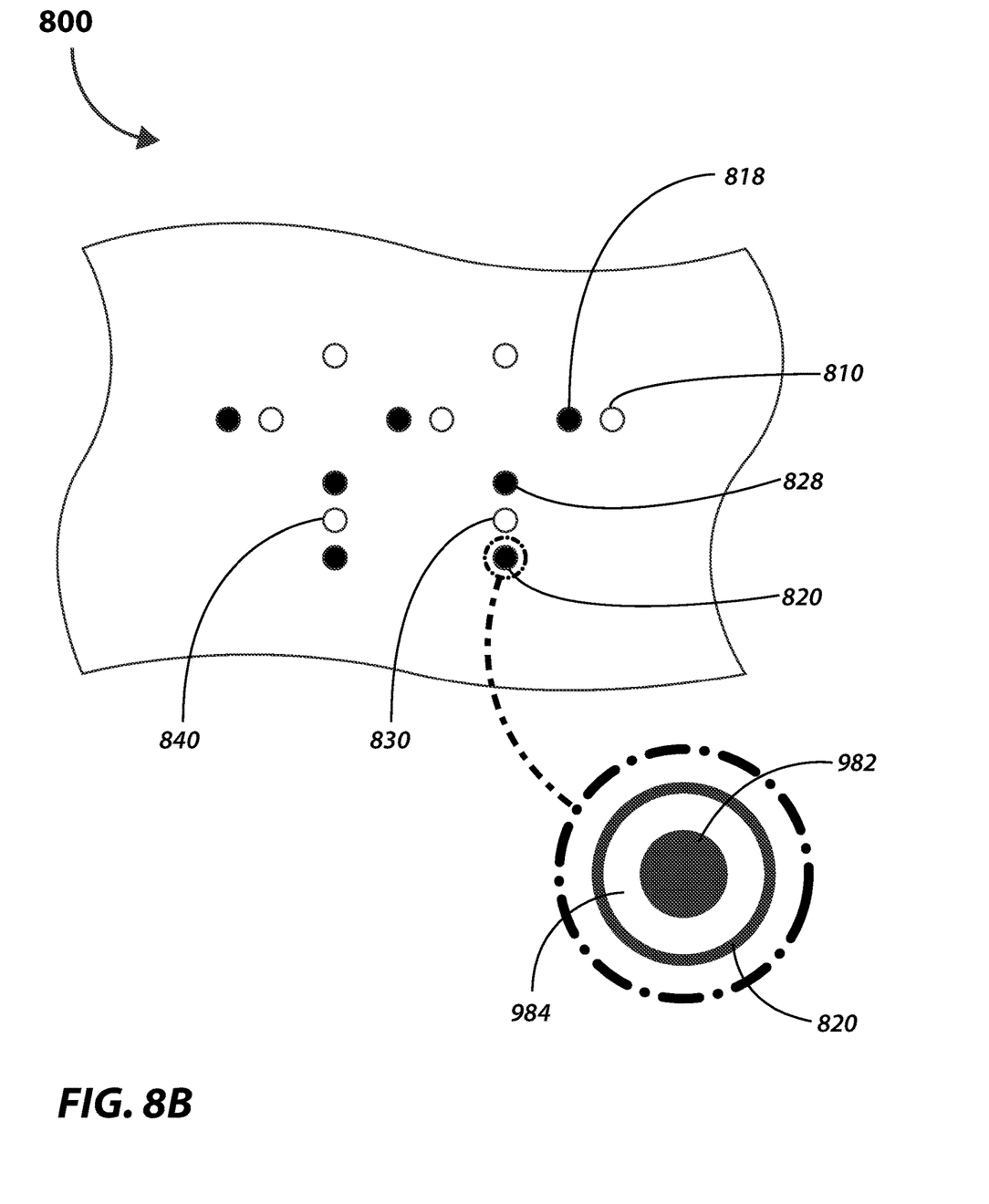
FIG. 8B shows a representative view of a small segment of a typical test probe contactor FIG. 1A.

FIG. 8B is a plan view illustrating a small part of an IC test probe contactor, which has a high pin density. Here, the bulk or body 800 of the test probe contactor is typically manufactured by machining a piece of aluminum to align its upper and lower surfaces and to make holes that will allow the connection pins or probes to be inserted. Although the same physical probe or pin assemblies can be used in any hole position, in a given application the functions can be divided into one of three types; power connections such as voltages, ground connections and signal input or output connections. As shown in FIG. 8B, signal input 810 is shown alongside a neighboring ground connection 818. Exemplary power input 830 is adjacent to a pair of ground or return connections 820 & 826, as is a signal output 840 of the DUT.

In simpler systems it is not uncommon to find only a single power connection and a single shared ground connection. However, in systems and circuits where input circuits are very sensitive and output circuits draw a significant amount of power, the interaction between them can be a matter for great concern. This problem is usually addressed by making sure that input circuits are suitable isolated from output circuits. In fact the difficulty can be so severe that a manufacturer will often publish guidance by way of a suggested printed wiring layout that is to be followed to ensure correct operation. The two usual concerns are the sharing of current paths between high and low current parts of the device in use and the high speed transmission lines which must be properly designed and routed to minimize the effects of signal reflections. The same caution of careful choice of current paths also applies to devices which have both analog and digital circuits present. In this invention we are particularly concerned with common mode problems that arise as a result of inadequate grounding when routing current paths.

Figure 9:
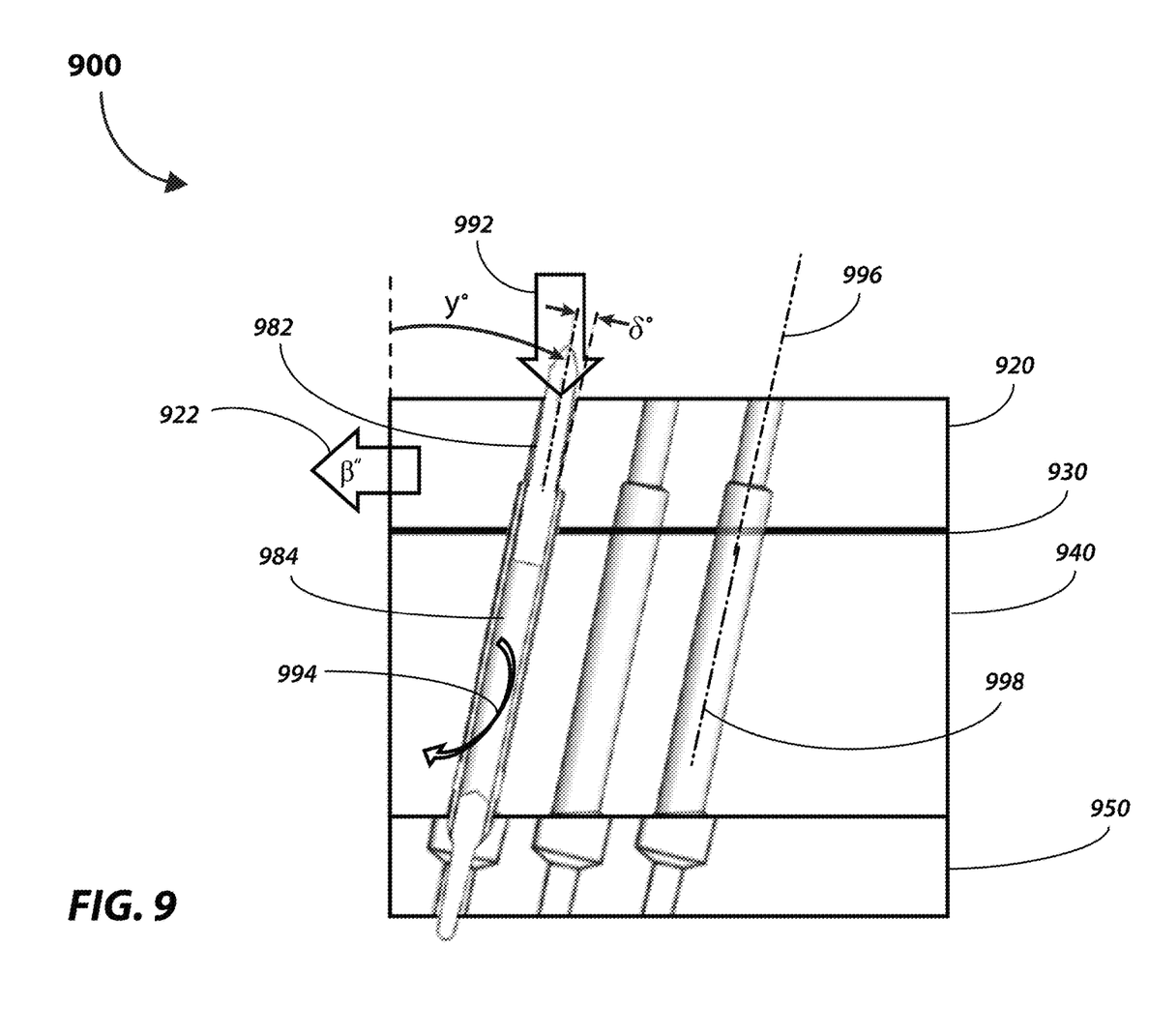
FIG. 9 illustrates an improved performance layout for one embodiment of an exemplary test probe contactor in accordance with the present invention.

FIG. 9 illustrates an exemplary enhanced-grounding Shifted Bore ("SB") slanted probe contactor 900 to reliably compensate for wear, in accordance with some embodiments of the present invention. By installing the contact pin assemblies 984 at a small angle y° relative to the termination pads and also to the DUT, every time a connection is made and the contact pins are compressed, some of the contact force 992 is resolved into a force along the longitudinal axis of the pin assembly and a force that is normal to the longitudinal axis. This lateral component causes the pins 982 to be skewed slightly off axis by a small amount δ° during compression and this bending force causes the pin to scrape against the inside of its enclosing shell.

The result is that with carefully selected angles the wear rate, though greater than when the applied force is solely axial, is only slightly increased yet the scraping action maintains the resistance at a low level throughout the life of the contactor 900. This is especially advantageous for ground connecting pin assemblies. The same is true of the signal bearing pins but the effect is small and somewhat less important. An added benefit is that the conductive spring no longer plays a significant part in being a current path because the resistance of the enclosing shell of the pin is considerably lower and any inductance of the coiled spring is rendered moot. Especially, any loss of spring performance due to fatigue is also reduced.

In some embodiments, retaining upper and lower blocks 920 and 950 respectively are drilled or bored to match the main block or base material but when assembled the pin assembly axis, i.e., Thru Hole Center Axis 996, is offset, as illustrated by Shifted C-Bore Center Axis 998, from the axis machined into the main block 940. In practice the bores may be drilled through the main block 940 and the upper block 920 and during assembly a lateral bias force 922 is applied that develops a lateral offset distance "Beta", which can range from, for example, 0.0005" to 0.001", such as 0.0008". In this embodiment, mounting alignment pins (not shown) are located so that when assembled this offset distance is already predetermined. This small offset "Beta" allows the pins to be held firmly when the contactor 900 is fully assembled without the need for a press fit. The lamination layer 930 that secures upper block 920 to main block 940 can be simply punched through when the pins assemblies are installed into the main block 940.

Suitable materials for lamination layer 930 include epoxies with compatible coefficient of expansion. Suitable materials for upper and lower blocks 920, 950 include plastics and composites. Suitable materials for main block 940 include conductive metals such as aluminum alloys.

When a load is applied to the pins compressing them and causing them to move slightly off axis within the enclosure of the pin assembly, the offset that secures the pin assembly by clenching them at the interface at 930 acts as a pivot point and this twisting load is reacted out as a Reactive Force Path 994 at the point where the pin assembly is in closest contact with the bore in the main block 940 in the appropriate direction. In one exemplary embodiment, the ground pin cavity can be internally shifted between approximately 0.0005" and 0.0008" thereby mechanically biasing the pin towards one side of the bore.

In some embodiments, as illustrated by FIG. 9, the cross-bias angle γ° can generally be between 3° and 12°, e.g., 10.77°, and the angle δ° that the pin makes relative to the longitudinal axis of the pin assembly is generally less than 2°, e.g., 1.51°, when the pin is depressed to its full extent by the DUT.

FIG. 10 illustrates extensive experimental laboratory testing has been undertaken to verify properties of the Shifted Bore contactor embodiment of FIG. 9 with its advantageous performance. Advantages of the above described embodiments also include improved longevity and reliability of the probe contactor, and expected reduction of susceptibility to impact of contaminants, as illustrated by the graph of FIG. 10.

While this invention has been described in terms of several embodiments, there are alterations, modifications, permutations, and substitute equivalents, which fall within the scope of this invention. For example, many modifications are possible and the above described features from the various embodiments can be useful alone or in combination. It is also contemplated that novel feature(s) of the above described systems and methods can be useful for both grounding and non-grounding pin structures. Although subsection titles have been provided to aid in the description of the invention, these titles are merely illustrative and are not intended to limit the scope of the present invention.

It should also be noted that there are many alternative ways of implementing the methods and apparatuses of the present invention. It is therefore intended that the following appended claims be interpreted as including all such alterations, modifications, permutations, and substitute equivalents as fall within the true spirit and scope of the present invention.

What is claimed is:

1. A slanted probe contactor for providing electrical contact between an array of contacts of an IC device under test (DUT) and a test board, the contactor comprising:
    a body portion having substantially parallel top and bottom faces defining a contactor interface wall which lies in an x-y plane and which has a perpendicular z-axis, the top face of said contactor interface wall being configured to receive a DUT which is placed contacts down on the top face, wherein the body portion includes a main block having a plurality of main close fitting slanted probe cavities, each main slanted probe cavity having a main bore axis being angled relative to the z-axis of the interface wall, and wherein the body portion also includes an upper block having a corresponding plurality of upper slanted probe body cavities and a corresponding plurality of close fitting slanted probe pin cavities;
    a plurality of depressible probes extending through said contactor interface wall, the plurality of depressible probes having probe pin tips and being angled relative to the z-axis of the interface wall such that the probe pin tips emerge from the top and bottom faces thereof, and wherein the plurality of depressible probes are arranged in different arrays of depressible probes, the depressible probes of one array of depressible probes being angled oppositely from the depressible probes of another array of depressible probes; and
    wherein an upper probe pin bore axis of at least one of the upper slanted probe pin cavities for housing a probe pin of one of the plurality of depressible probes is laterally shifted by a small β (beta) relative to the main bore axis of a corresponding one of the main close fitting slanted probe cavities, thereby mechanically and angularly tilting the probe pin by a small δ (delta) relative to the upper probe pin bore axis and clenching the corresponding one of the plurality of depressible probes at an interface between the main block and the upper block, the interface acting as a pivot point for generating a twisting load along a reactive force path at a point where the one of the plurality of depressible probes is in closest contact with the corresponding one of the plurality of main close fitting slanted probe cavities to secure the one of the plurality of depressible probes in the corresponding one of the main slanted probe cavities while allowing unimpeded motion of the probe pin within the at least one of the upper close fitting slanted probe pin cavities and without bending the probe pin.

2. The slanted probe contactor of claim 1 wherein the upper probe pin bore axis is shifted between 0.0005" and 0.0008" relative to the main bore axis.

3. The slanted probe contactor of claim 1 wherein when the DUT is compressed against the probe contactor, a reactive force path is generated at a portion of the at least one depressible probe that is in closest contact with the corresponding main slanted probe cavity of the main block.

4. The slanted probe contactor of claim 1 wherein the plurality of depressible probes are spring probes.

5. The slanted probe contactor of claim 1 wherein the plurality of depressible probes are grounding probes.

6. A method of providing electrical contact between an array of contacts of an IC device under test (DUT) and a test board, the method comprising:
    mounting a probe contactor having an array of depressible probes to the test board wherein probe tips of the depressible probes emerge from an interface wall of the contactor at an angle relative to the perpendicular z-axis of said interface wall;
    selecting a DUT having an array of contacts that correspond to the array of depressible probes of the contactor;
    pressing the DUT into the contactor against the contactor interface wall in the direction of the z-axis of the interface wall such that the array of contacts on the DUT are pressed against the angled depressible probes of the contractor;
    removing the DUT from the contactor after test;
    wherein a main block of the contactor includes a plurality of main close fitting slanted probe cavities, each main probe cavity having a main bore axis angled relative to the z-axis of said interface wall;
    wherein an upper block of the contactor includes a corresponding plurality of upper slanted probe body cavities and a corresponding plurality of close fitting slanted probe pin cavities; and
    wherein an upper probe pin bore axis of at least one of the upper probe pin cavities for housing a probe pin of one of the plurality of depressible probes is laterally shifted by a small β (beta) relative to the main bore axis of a corresponding main close fitting probe cavity of the main block, thereby mechanically and angularly tilting the probe pin by a small δ (delta) relative to the upper probe pin bore axis and clenching the at least one probe at an interface between the main block and the upper block, the interface acting as a pivot point for generating a twisting load along a reactive force path at a point where the one of the plurality of depressible probes is in closest contact with the corresponding one of the plurality of main close fitting slanted probe cavities to secure the one of the plurality of depressible probes in the corresponding main probe cavity while allowing unimpeded motion of the probe pin within the at least one of the upper close fitting slanted probe pin cavities and without bending the probe pin.

7. The method of claim 6 wherein the upper probe pin bore axis is shifted between 0.0005" and 0.0008" relative to the main bore axis.

8. The method of claim 6 wherein when the DUT is compressed against the probe contactor, a reactive force path is generated at a portion of the at least one of the probe that is in closest contact with a corresponding main probe cavity of the main block.

9. The method of claim 6 wherein the plurality of depressible probes are spring probes.

10. The method of claim 6 wherein the plurality of depressible probes are grounding probes.

* * * * *